(12) United States Patent
Reedman

(10) Patent No.: US 11,277,120 B2
(45) Date of Patent: Mar. 15, 2022

(54) DYNAMIC SIGNAL PROCESSING

(71) Applicant: INTERNATIONAL BUSINESS MACHINES CORPORATION, Armonk, NY (US)

(72) Inventor: Ivan James Reedman, Cheltenham (GB)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 163 days.

(21) Appl. No.: 16/299,596

(22) Filed: Mar. 12, 2019

(65) Prior Publication Data

US 2020/0295738 A1   Sep. 17, 2020

(51) Int. Cl.
*H03H 17/06* (2006.01)

(52) U.S. Cl.
CPC .... *H03H 17/0664* (2013.01); *H03H 17/0657* (2013.01)

(58) Field of Classification Search
CPC ... H03H 17/0621–0664; H03H 17/0657–0664
See application file for complete search history.

(56) References Cited

U.S. PATENT DOCUMENTS

| 7,877,621 | B2 | 1/2011 | Jacoby et al. |
| 8,332,945 | B2 | 12/2012 | Kim et al. |
| 8,594,168 | B2 | 11/2013 | Cheng et al. |
| 8,688,219 | B2 | 4/2014 | Ransom |
| 9,215,151 | B1 | 12/2015 | De Rosa et al. |
| 9,860,257 | B1 | 1/2018 | Kumar et al. |
| 2002/0193090 | A1 | 12/2002 | Sugar et al. |
| 2004/0052300 | A1* | 3/2004 | Lopez-Estrada ... H03H 17/0642 375/130 |
| 2008/0068234 | A1* | 3/2008 | Forman ............... H03H 17/0628 341/61 |
| 2010/0313270 | A1 | 12/2010 | Kim et al. |

(Continued)

FOREIGN PATENT DOCUMENTS

| CN | 104346262 A | 2/2015 |
| CN | 105025141 A | 11/2015 |

(Continued)

OTHER PUBLICATIONS

A. Arar, Steve. "Basics of Digital Down-Conversion in DSP—Technical Articles." All About Circuits, 2018, www.allaboutcircuits.com/technical-articles/dsp-basics-of-digital-down-conversion-digital-signal-processing/. (Year: 2018).*

(Continued)

*Primary Examiner* — Emily E Larocque
*Assistant Examiner* — Huy Duong
(74) *Attorney, Agent, or Firm* — Cuenot, Forsythe & Kim, LLC

(57) ABSTRACT

As part of a signal processing event, the maximum frequency of an input signal can be determined with a processor. The maximum frequency can be compared to a value generated with a decimator/interpolator. Based on the comparison, the sampling rate for sampling the input signal with the processor can be set as part of the digital signal processing event. The sampling rate can be adjusted as the frequency of the input signal varies during the signal processing event.

17 Claims, 11 Drawing Sheets

(56) References Cited

U.S. PATENT DOCUMENTS

| | | |
|---|---|---|
| 2014/0337647 A1 | 11/2014 | Jiang |
| 2015/0301570 A1 | 10/2015 | Fine |
| 2016/0048682 A1 | 2/2016 | Gou et al. |
| 2016/0098561 A1 | 4/2016 | Keller et al. |
| 2017/0004303 A1 | 1/2017 | Yan |
| 2018/0062844 A1 | 3/2018 | Dubeuf et al. |
| 2020/0034529 A1 | 1/2020 | Reedman et al. |

FOREIGN PATENT DOCUMENTS

| | | |
|---|---|---|
| CN | 105187608 A | 12/2015 |
| CN | 106415583 A | 2/2017 |
| WO | 20200021463 A1 | 1/2020 |

OTHER PUBLICATIONS

Datta, Srabosti. "Power Reduction By Dynamically Varying Sampling Rate." UKnowledge, 2006, uknowledge.uky.edu/gradschooLtheses/275/. (Year: 2006).*

W. R. Dieter, S. Datta and Wong Key Kai, "Power reduction by varying sampling rate," ISLPED '05. Proceedings of the 2005 International Symposium on Low Power Electronics and Design, 2005., San Diego, CA, 2005, pp. 227-232, doi: 10.1145/1077603.1077658. (Year: 2005).*

Lyons, Richard. "A quadrature signals tutorial: Complex, but not complicated." DSPRelated. coml DSP (2013). (Year: 2013).*

P. Karuppanan and K. Mahapatra, "PLL with PI, PID and Fuzzy Logic Controllers based shunt Active Power Line Conditioners," 2010 Joint International Conference on Power Electronics, Drives and Energy Systems & 2010 Power India, New Delhi, 2010, pp. 1-6, doi: 10.1109/PEDES.2010.5712506. (Year: 2010).*

Arar, Steve. "Basics of Digital Down-Conversion in DSP—Technical Articles." All About Circuits, 2018, www.allaboutcircuits.com/technical-articles/dsp-basics-of-digital-down-conversion-digital-signal-processing/. (Year: 2018).*

Analog, Devices Inc., Engineeri, Engineeri, et al. Data Conversion Handbook, Elsevier Science & Technology, 2004. ProQuest Ebook Central, https://ebookcentral.proquest.com/lib/uspto-ebooks/detail.action?docID=226785. (Year: 2004).*

Shima, James. FM Demodulation Using Digital Radio and Digital Signal Processing . 1995, www-elec.inaoep.mx/~rogerio/Digradio.pdf. (Year: 1995).*

Doerry, Armin W. "Mathematics of Signal Manipulation and Processing for Radar." Mathematics of Signal Manipulation and Processing for Radar. (Conference) | osti.gov, Nov. 1, 2017, www.osti.gov/servlets/purl/1484080. (Year: 2017).*

Zhong, Jinghua. PID Controller Tuning: A Short Tutorial. 2006, web.archive.org/web/20150421081758/saba.kntu.ac.ir/eecd/pcl/download/PIDtutorial.pdf. (Year: 2006).*

Chen, Y. et al., "Design considerations for variable-rate digital signal processing," In 2016 IEEE Int'l. Sym. on Circuits and Systems (ISCAS), May 22, 2016, pp. 2479-2482, IEEE.

Yu, J.Y. et al., "Power Reduction with Dynamic Sampling and All-Digital I/Q-Mismatch Calibration for A MB-OFDM UWB Baseband Transceiver," System. Jun. 2006, vol. 7, No. 2, 4 pg.

IBM: List of IBM Patents or Patent Applications Treated as Related, 2 pg.

Reedman et al., "Detection of Compromise Through Automated Power Analysis," U.S. Appl. No. 16/415,706, filed May 17, 2019, 43 pg. (A copy is not provided as this application is available to the Examiner.).

Reedman et al., "Detection of Compromise Through Automated Power Analysis," WIPO Appln. No. PCT/IB2019/056312, filed Jul. 24, 2019, now published as No. WO2020021463A1.

WIPO Appln. PCT/ib2019/056312, International Search Report and Written Opinion, dated Jan. 8, 2020, 8 pgs.

Ransford et al., "Watt, Me Worry? Analyzing AC Power to Find Malware," RSA Conference 2015, San Francisco, Apr. 20-24, 2015, Session ID: BR-W03, 54 pgs.

"What is I/Q Data?—National Instruments Tutorial," [online] © 2020 National Instruments., Oct. 16, 2019, retrieved from the Internet: <http://www.ni.com/tutorial/4805/en/>, 5 pgs.

Hernandez Jimenez et al., "Towards a Malware Detection Framework Based on Power Consumption Monitoring," [online] IEEE, retrieved Apr. 8, 2020, retrieved from the Internet: <http://community.wvu.edu/~kagoseva/Papers/IEEE_Security_Privacy_2016.pdf>, 2 pgs.

Zefferer et al., "Power Consumption-based Application Classification and Malware Detection on Android Using Machine-Learning Techniques," [online] Future Computing 2013: The Fifth International Conference on Future Computational Technologies and Applications, retrieved from the Internet: <https://pure.tugraz.at/ws/portalfiles/portal/2686377/paper.pdf>, pp. 26-31, © IARIA 2013.

Azmoodeh et al., "Detecting crypto-ransomware in IoT networks based on energy consumption footprint," Journal of Ambient Intelligence and Humanized Computing, 2018, vol. 9, No. 4, pp. 1141-1152.

Canny, "A Computational Approach to Edge Detection," IEEE Transactions on Pattern Analysis and Machine Intelligence, vol. PAMI-8, No. 6, pp. 679-698, Nov. 1986.

Flack et al., "I/Q Sample demodulation to input data," [Online] © 2021 Stack Exchange Inc., Nov. 20, 2016, retrieved from the Internet: <https://dsp.stackexchange.com/questions/35694/i-q-sample-demodulation-to-input-data>, 5 pgs.

Porle, R.R. et al., "A Survey of Filter Design for Audio Noise Reduction," Journal of Advanced Review on Scientific Research, vol. 12, No. 1, pp. 26-44, 2015.

Stoess et al., "Energy Management for Hypervisor-Based Virtual Machines," USENIX, 2007, 14 pgs.

* cited by examiner

DYNAMIC SIGNAL PROCESSING

BACKGROUND

The present disclosure relates to signal processing systems, and more particularly, to digitally processing signals exhibiting variable frequencies.

Digital signal processing (DSP) is in many instances an important component of the way in which a computer or similar type system receives externally generated signals and processes the signals into usable data output. DSP is for many such systems the technology that allows a system to interact with and "understand" the environment in which the system operates. Signal processing techniques have broad applicability in fields such as image recognition, speech recognition, autonomous vehicles, robotics, machine learning and many other applications. Such applications are usually implemented with a system having considerable processing capabilities, as the processing requirements are directly proportional to the bandwidth of the system. Accordingly, such systems can be characterized as processor-intensive. The maximum bandwidth the system supports can dictate the system's power requirements.

SUMMARY

A method includes determining, with a processor, a maximum frequency of an input signal. The method can include comparing the maximum frequency to a current decimator/interpolator value. Based on the comparison, the method can include setting a sampling rate for sampling the input signal with the processor as part of a digital signal processing event.

A system includes at least one processor programmed to initiate executable operations. The executable operations can include determining a maximum frequency of an input signal. Additionally, the executable operations can include comparing the maximum frequency to a current decimator/interpolator value. The executable operations also can include setting a sampling rate for sampling the input signal based on the comparison as part of a digital signal processing event.

A computer program product includes a computer-readable storage medium having program code stored thereon, the program code executable by a computer to initiate operations. The operations can include determining, with a processor, a maximum frequency of an input signal. Additionally, the operations can include comparing the maximum frequency to a current decimator/interpolator value. The operations also can include setting a sampling rate for sampling the input signal with the processor, based on the comparison, as part of a digital signal processing event.

DETAILED DESCRIPTION

The present disclosure pertains to signal processing systems. The processing requirements of such a system are in many instances directly proportional to the bandwidth supported by the system.

For a discrete signal processing system, the sampling rate is at least twice the desired maximum frequency. The frequency (e.g., the desired maximum frequency) is usually the highest frequency which a sampled data system can reproduce without error. For example, if in processing an audio signal with a speech recognition system the expected maximum frequency of the speaker's speech is 3 kHz, then the sampling rate must be at least 6 kHz to capture the expected maximum frequency. Downstream filters and processing blocks also operate at the rate of at least 6 kHz. Similarly, with fast Fourier transform (FFT) analysis used, for example, in image recognition the same requirement applies with respect to edge detection and image characterization algorithms. Other examples apply equally as well.

There is a direct relationship between the bandwidth a system supports and the system's power requirements. Accordingly, the maximum bandwidth a system is designed to support dictates the system's power requirements. To conserve power, some systems are designed to operate in two states, namely, an active state and a power-conserving idle state. Such a system conserves power by severely constraining or ceasing processing while in an idle state.

The methods, systems, and computer program product disclosed herein provide a different approach to signal processing by implementing a signal processing system that dynamically adjusts data rate processing frequency as signal frequencies vary. According to one embodiment, a dynamic data rate signal processing system enables adjustment of the processing frequency of a central processing unit (CPU) or other processor in real time.

A dynamic data rate signal processing system, as disclosed herein, can provide just enough processing speed to ensure capture of the highest frequency of a data stream by a signal processor or processing algorithm. If, for example, the frequency within the data stream fluctuates, the system processor's speed is capable of adjusting so that the signal processor or processing algorithm has adequate processing resources to handle the data stream without undue expenditure of energy. The system thus tends to minimize energy usage. The benefit of such an approach is especially pronounced for any signal processing system designed to process an incoming data stream at a frequency that is dynamic over a broad range. If the variation is considerable, the system can generate substantial reductions in power consumption.

Figure 1:
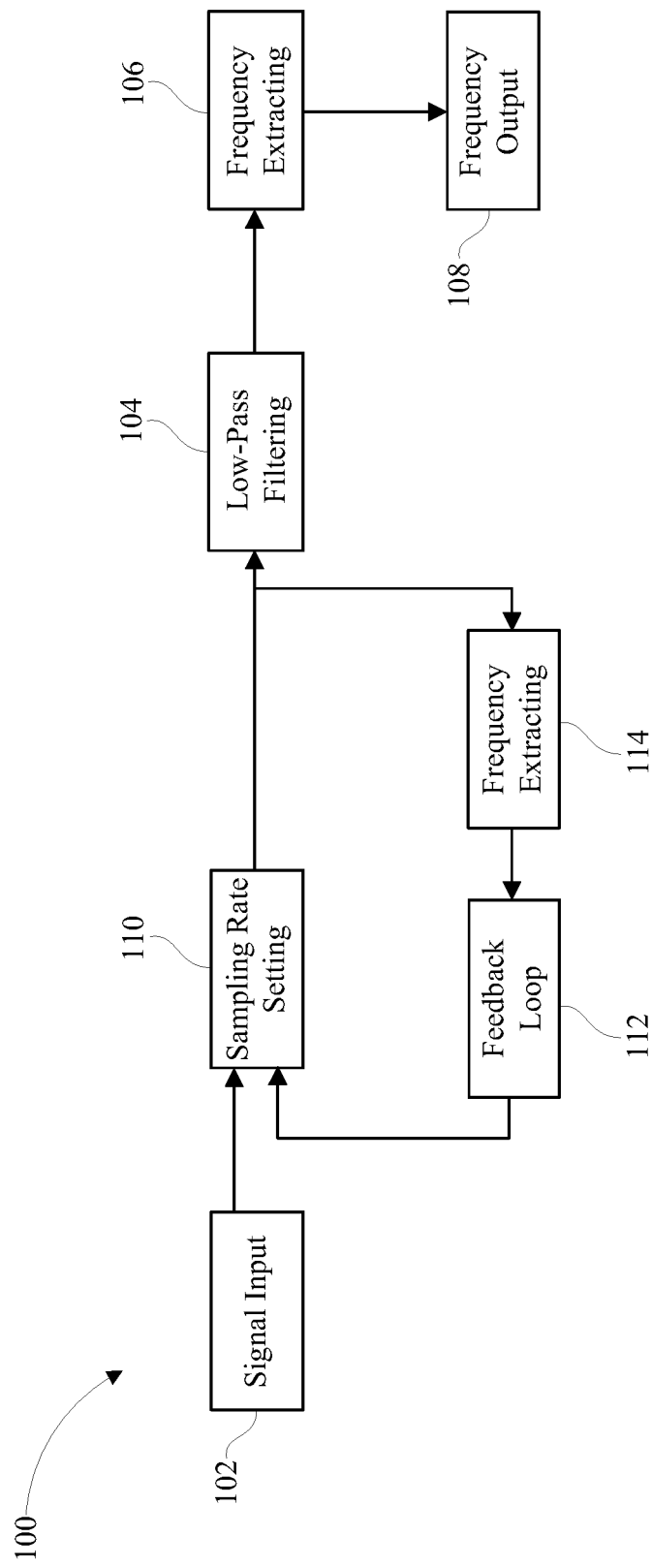
FIG. 1 depicts certain operative features of a system for dynamically setting rates for sampling a signal input to a filter and extracting from the filter a frequency of the sample according to one embodiment.

FIG. 1 depicts certain operative features 100 of one embodiment of a system for dynamically setting rates for sampling a signal input. A signal from a source (not shown) is received at block 102. The signal can be, for example, the output of an analog-to-digital converter (ADC). The received signal can be a digital stream from, for example, a voice recording or other source of digitized signals. The data enters the system at a fixed number of samples per second. Although the system receives a fixed-rate data stream, in other embodiments, the system can receive a variable-rate data stream.

The signal is filtered at block 104 by a low-pass filter. The filter can be, for example, a finite impulse response (FIR) filter or other type of filter for facilitating the processing of digital signals in the context of different applications. A value representing the frequency of the sample is extracted at block 106 by a frequency extractor. The value can be extracted for example by the process of conjugate multiplication (e.g., multiplication of a complex representation of the signal by the signal's complex conjugate). The multiplier (gain) value can be fixed and is related to the sampling rate (samples per second) by the radians-per-second gain of the output at block 108.

Figure 2:
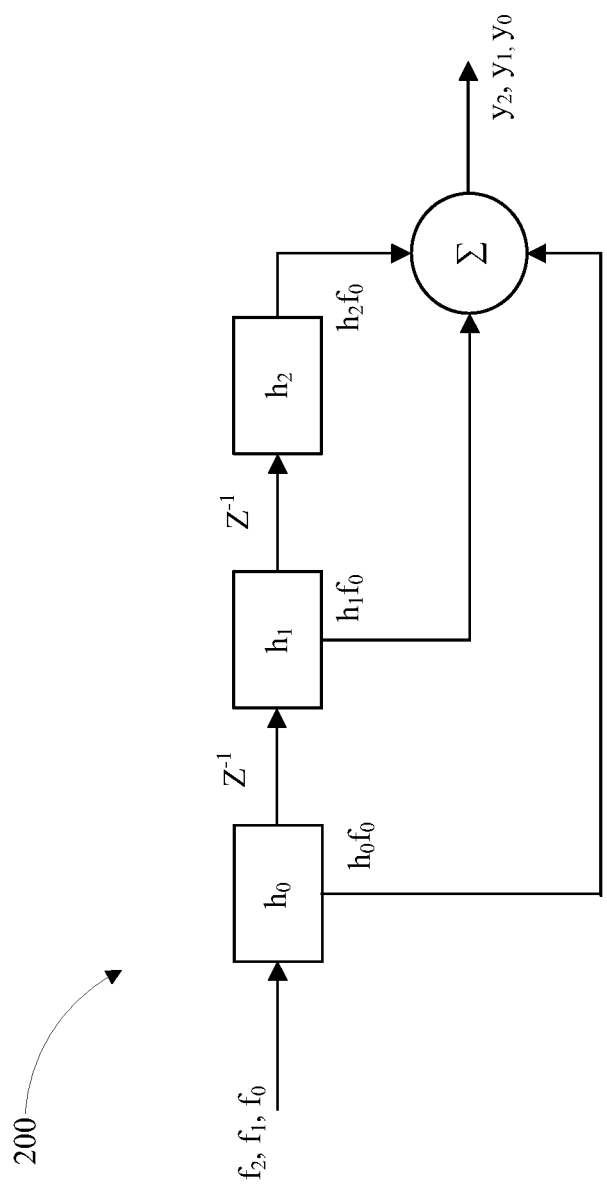
FIG. 2 depicts an example of a finite response filter (FTR) as used by a system for dynamically setting sampling rates according to one embodiment.

As noted above, the system's power consumption is influenced by the signal bandwidth that the system is required to handle during a signal processing event. Power consumption is also affected by the nature and extent of the signal processing performed. For example, if the low-pass filter is a FIR filter, the filter architecture comprises a sequence of coefficient-delay pairs, typically termed "taps." Referring additionally to FIG. 2, the logical structure of an example FIR filter is shown, with outputs $y_2$, $y_1$, $y_0$ generated by feeding inputs $f_2$, $f_1$, $f_0$ into the three-tap filter comprising coefficients $h_2$, $h_1$, $h_0$; the delays are indicated as $z^{-1}$. Although, FIR filter 200 illustratively comprises only three taps, it is not unusual for such a filter to comprise as many as 1,000 or more taps. Thus, for every sample input into the system, that sample and the 999 prior samples must run through the filter to generate an output sample. Other signal processing systems exhibit similar processing intensity-resource consumption correlations.

In the context of digital signal processing, one consideration is the number of samples of the signal needed per period to capture the maximum frequency of the signal bandwidth. According to Nyquist's theorem, accurate representation of the signal requires that the system sample the signal at a sampling rate greater than twice the highest frequency component present in the signal. This consideration underpins the approach taken with the system disclosed herein for dynamically setting rates for sampling a signal.

Following the approach, the system adjusts a processor's core frequency as the frequency of a signal processed by the system varies. The core frequency indicates the processing speed of a processor (e.g., CPU) or a single core of a multi-core processor and is typically measured as clock cycles per second or, equivalently, Hertz. The system affects the processor core frequency by dynamically adjusting signal sampling frequency as the frequency of the signal input, or data stream, being sampled varies. The system can dynamically adjust the signal sampling frequency in real time. The system dynamically sets the system's sampling rate depending on the highest frequency component of the signal input, or data stream, that the system needs to capture to adequately process the signal input.

The sampling rate of the input signal can be changed at block 110 by interposing between the signal input and the downstream low-pass filter a mechanism for setting the sampling rate. The mechanism can comprise a dual-function sampling rate decimator/interpolator. The decimator/interpolator can decrease or increase the sampling rate in response to a control signal.

The decimator/interpolator increases the sampling rate by estimating intermediate sample values (interpolation), each of which is inserted into the sequence at the point of interpolation. The decimator/interpolator decreases the sampling rate by a process of decimation. A sequence of sampled values is decimated, or "downsampled," by a factor of D if every $D^{th}$ sample is retained and the remaining samples are discarded. Accordingly, relative to the original sample rate $f_{old}$, the new sample rate $f_{new}$ is $$f_{new}=f_{old}/D$$

For example, to decimate a sequence $x_{old}(n)$ by a factor of D=3, $x_{old}(0)$ is retained while $x_{old}(1)$ and $x_{old}(2)$ are discarded; $x_{old}(3)$ is retained while $x_{old}(4)$ and $x_{old}(5)$ are discarded; $x_{old}(6)$ is retained, and so on. Accordingly, $x_{new}(n)=x_{old}(3n)$, where n=0, 1, 2, ..., N (N is any integer). The sample resulting from the decimation process is that which would have been generated by sampling the same signal albeit at a rate of $f_{new}$.

Figure 3:
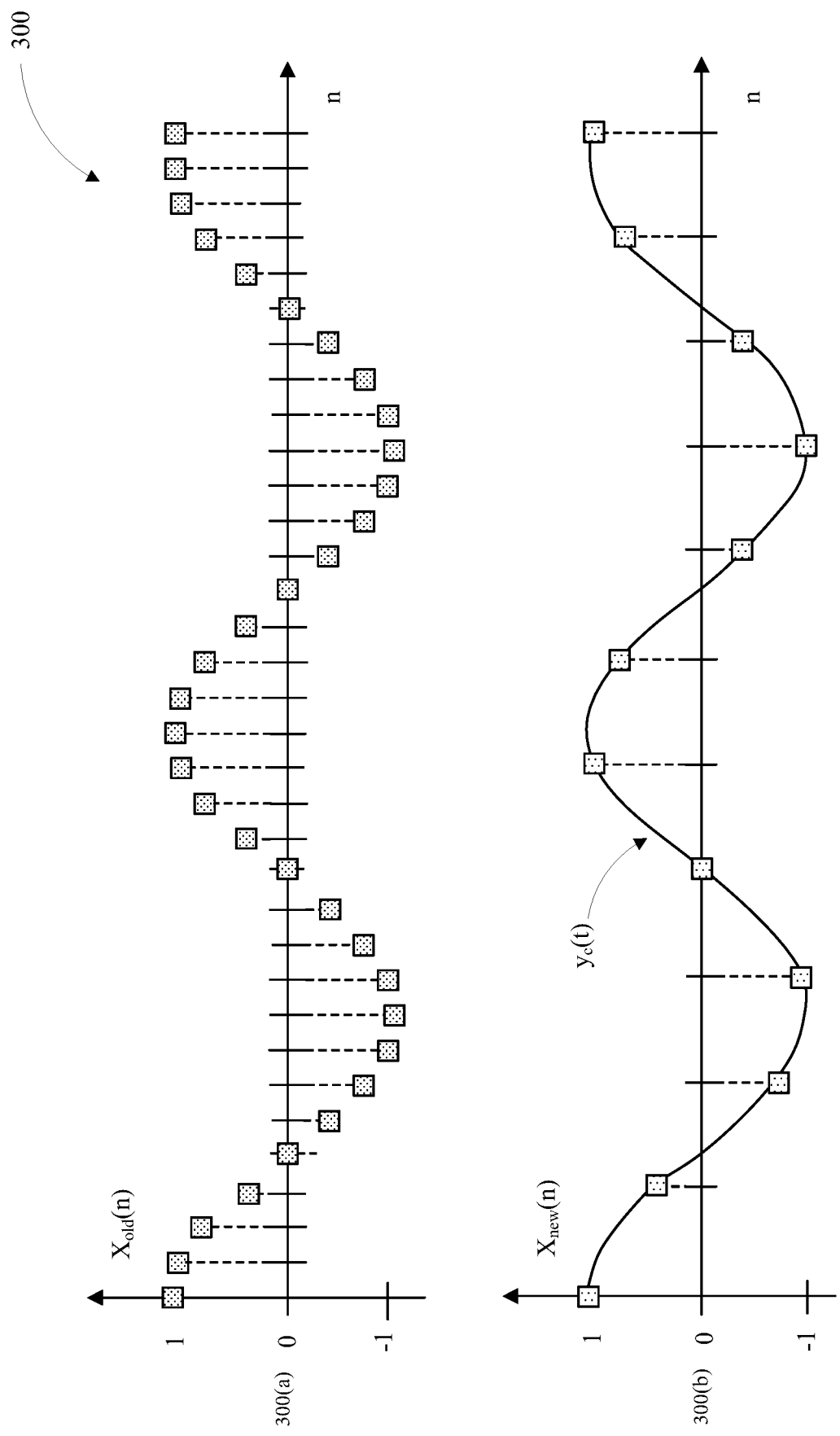
FIG. 3 depicts an example sampling rate frequency as used by a system for dynamically setting sampling rates according to one embodiment.
Figure 4:
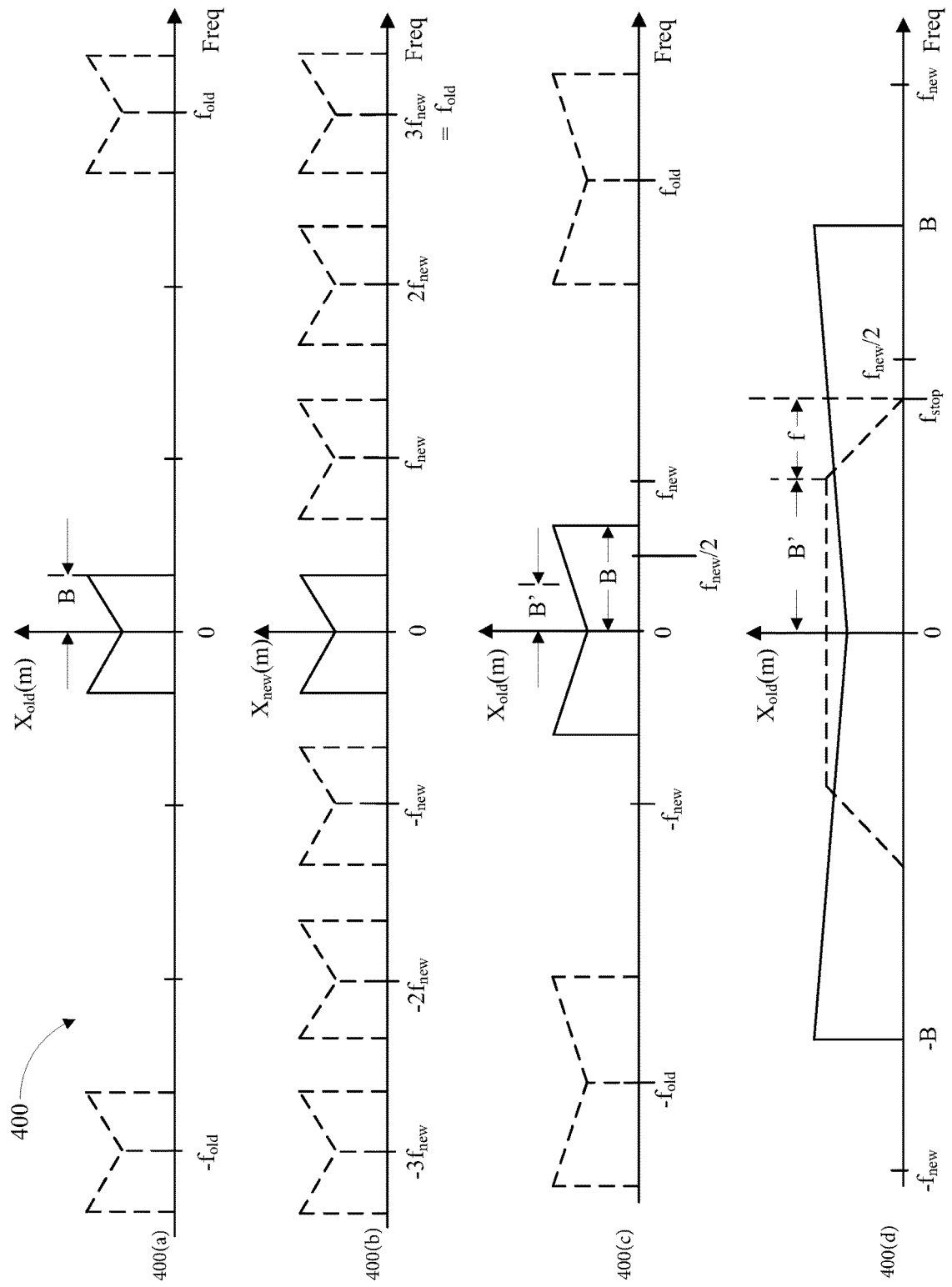
FIG. 4 depicts an example frequency spectrum as used by a system for dynamically setting sampling rates according to one embodiment.

Referring additionally to FIG. 3, decimation 200 is illustrated by juxtaposing the original sequence 300($a$) and the newly decimated-by-three sequence 300($b$). Also referring additionally to FIG. 4, the spectral implications of decimation are illustrated assuming an original continuous signal. The spectrum of the original bandlimited signal is indicated by the solid lines. 400($a$) shows $X_{old}(m)$, the discrete replicated spectrum of $x_{old}(n)$. 300($b$) shows $X_{new}(m)$, the discrete spectrum of $x_{new}(n)=x_{old}(3n)$.

Referring still to FIG. 1, as needed, an adjustment to the sampling rate is made at block 110 by incrementing (e.g., interpolating) or decrementing (e.g., decimating) the current sampling rate. The determination of whether—and if so, by how much—to increment or decimate the signal sampling rate at block 110 is made through feedback loop 112. Two inputs are fed to feedback loop 112: the maximum frequency of the sample, determined by frequency extraction at block 114, and a current decimator/interpolator value for adjusting/setting the sampling rate. (The value is zero if no adjustment is needed; otherwise the value indicates how many samples to decimate or interpolate.) If the current sampling rate is below a rate necessary to capture the highest frequency component of the signal, the decimator/interpolator increases the rate by implementing the interpolation process described above. Conversely, the sampling rate is decimated if the current sampling rate is above the rate need to capture the highest frequency component, which per the Nyquist theorem should be above twice the highest frequency component of the signal. The sampling rate changes in response to the feedback provided by feedback loop 112 as the frequency of the input signal, or data stream, varies.

For example, if the system as currently configured samples at a rate of 6 kHz but need only process a 2.5 kHz signal, the decimator/interpolator at block 110 decimates or downsamples the sampling rate to 5 kHz, twice the 2.5 kHz signal. A gain value for the filter can be calculated in real time to ensure a ±2.5 kHz output. Optionally, a response "window" of x % can be added to the highest frequency, which enables feedback loop 112 to scale up or down to ensure adequate bandwidth coverage. For example, a 10% window would ensure that though a 2.5 kHz bandwidth is assumed, the system can accurately measure up to 2.75 kHz.

When the input frequency increases up to the maximum of the x %-window, the system in one embodiment reverts to the maximum sampling rate the system is configured to handle (e.g., with a maximum 3 kHz bandwidth, a 6 kHz sampling rate can be the default setting that is decimated only if the system needs to capture a lower frequency). If the system is oversampling at that rate, the decimator/interpolator at block 110 can repeat the procedure of downsampling until the signal input frequency is within the x %-window. In alternative embodiment, the decimator/interpolator block at 110 can respond to the signal input frequency reaching the x %-window maximum by iteratively increasing the sampling rate (up to a maximum imposed, for example, by hardware constraints). The sampling rate can be increased by the system halting downsampling so that no samples from a data stream are discarded. If needed to further increase the sampling rate, additional samples can be obtained by interpolation. Sampling can be increased until a new x %-window is centered on the maximum frequency component of the signal input.

In one embodiment, the system receives a fixed-rate data stream and is configured to operate at a default data rate that is decimated only if the default data rate is higher than that of the received data stream. If the default rate of the system is higher than that of the received data stream, the system is capable of scaling down to the appropriate data rate to match that of the received data stream. For example, if as in the previous example, the default setting is a 6 kHz sampling rate but the rate of the received data stream is 2.5 kHz, then the system can scale down to a 5 kHz sampling rate. The system, as described above, resets to the default data rate when the system detects a reset condition (e.g., detect data stream frequency at the top of the x %-window, detect a reset signal, detect lack of input signal for a predetermined length of time).

As described below, the system can change the processor core frequency as the sampling rate changes. To conserve power, the processor core frequency can be reduced as the sampling rate is decreased. In the event that the signal input frequency reaches the x %-window maximum, the system can increase the processor core frequency to accommodate a corresponding increase in the sampling rate as the system adjusts the maximum and minimum of the x %-window to the now-higher maximum frequency.

In one embodiment, feedback loop 112 for adjusting the decimator/interpolator at block 110 is implemented with proportional, integral, and derivative (PID) control. A proportional component or coefficient, $K_p$, can reflect a difference between a current sampling rate and a rate that captures the highest frequency component. An integral component or coefficient, $K_i$, can reflect, and if necessary, compensate for any differences accumulated over time. A derivative component or coefficient, $K_d$, can compensate, if necessary, for rapid fluctuations in the difference between the sampling rate and the rate that captures the highest frequency component. The $K_p$, $K_i$, and $K_d$ coefficients can be tuned, or adjusted, to generate a new decimator/interpolator value based on comparing the maximum frequency of the sample, determined by frequency extraction at block 114, and the current decimator/interpolator value. The new decimator/interpolator value determines the decrease or increase in the sampling rate as the input signal frequency changes up or down.

In another embodiment, the signal filtering at block 104 dynamically adjusts rates for sampling a signal input in the specific context of digital signal processing performed with a FIR filter. Power consumption in processing a signal with a FIR filter can be influenced by the number of taps (coefficient-delay pairs) of the FIR filter. The number of taps can be affected by the sampling rate. For example, the so-called "Harris rule of thumb" approximates the number of taps, $N_{taps}$, with the following equation: $N_{taps}$=attenuation (dB)/(22*$B_T$), where $B_T$ is a normalized transition band equal to the ratio the difference between the stop and pass band frequencies, $\Delta F=F_{stop}-F_{pass}$, relative to the sampling rate, $F_s$. (See, e.g., *Multirate Signal Processing for Communication Systems*, Fredric J. Harris (2004), at p. 216.)

With this embodiment, the system includes multiple groups of pre-calculated FIR taps, each group corresponding to a specific sampling frequency. For example, the system can be implemented with a lookup table, each entry of which is a row vector $v^T=(f_{si}, c_{i1}, \ldots, c_{in})$, i=1, 2, ..., m, where m and n are any, not necessarily equal, integers; $f_{si}$ is a sampling rate extracted based on the incoming signal as described above; and $c_{i1}, \ldots, c_{in}$, are the pre-calculated coefficients of the $i^{th}$ group of taps corresponding to frequency $f_{si}$. If the FIR filter is implemented with processor-executable code, the coefficient values can be read from the table and used to process in the signal input. If the FIR filter is implemented in hardwire circuitry, the coefficient values can be used to set the filter parameters. For a particular frequency, the system selects a correct one of the m groups of taps for filtering the incoming signal, the group of taps configured to provide sufficient processing capability but no more than necessary to thereby mitigate power consumption. For example, one group of taps can comprise 100 taps whereas another only 50 taps. In one embodiment, the latter group of taps is constructed by including every other tap (first, third, etc.) of the former group and is used when signal processing can be performed with only 50 taps, making the use of 100 taps an unnecessary drain of power.

In one embodiment, frequency is extracted at blocks 106 and 114 using quadrature demodulation (e.g., with a quadrature demodulator). A quadrature demodulator performs conjugate multiplication and in complex number theory provides an output with a linear relationship to the frequency contained within an I/Q stream. (The I/Q stream can be generated using I/Q digital signal processing and multiplying the discrete sample values by a complex exponent $e^{j\omega}=\cos \omega + j \sin \omega$, where $\omega$ denotes the frequency.)

In other embodiments, the frequency extraction at blocks 106 and 114 can be implemented using various techniques. In one embodiment, for example, the system can use fast Fourier transforms (implemented, for example, in processor-executable code). In another embodiment (also implemented, for example, in processor-executable code), frequency extraction can be implemented using for example wavelet transforms that break down the input signal as a weighted sum of time-limited functions (wavelets). Other known techniques also can be used to extract a frequency as part of dynamically setting sampling rates.

Figure 5:
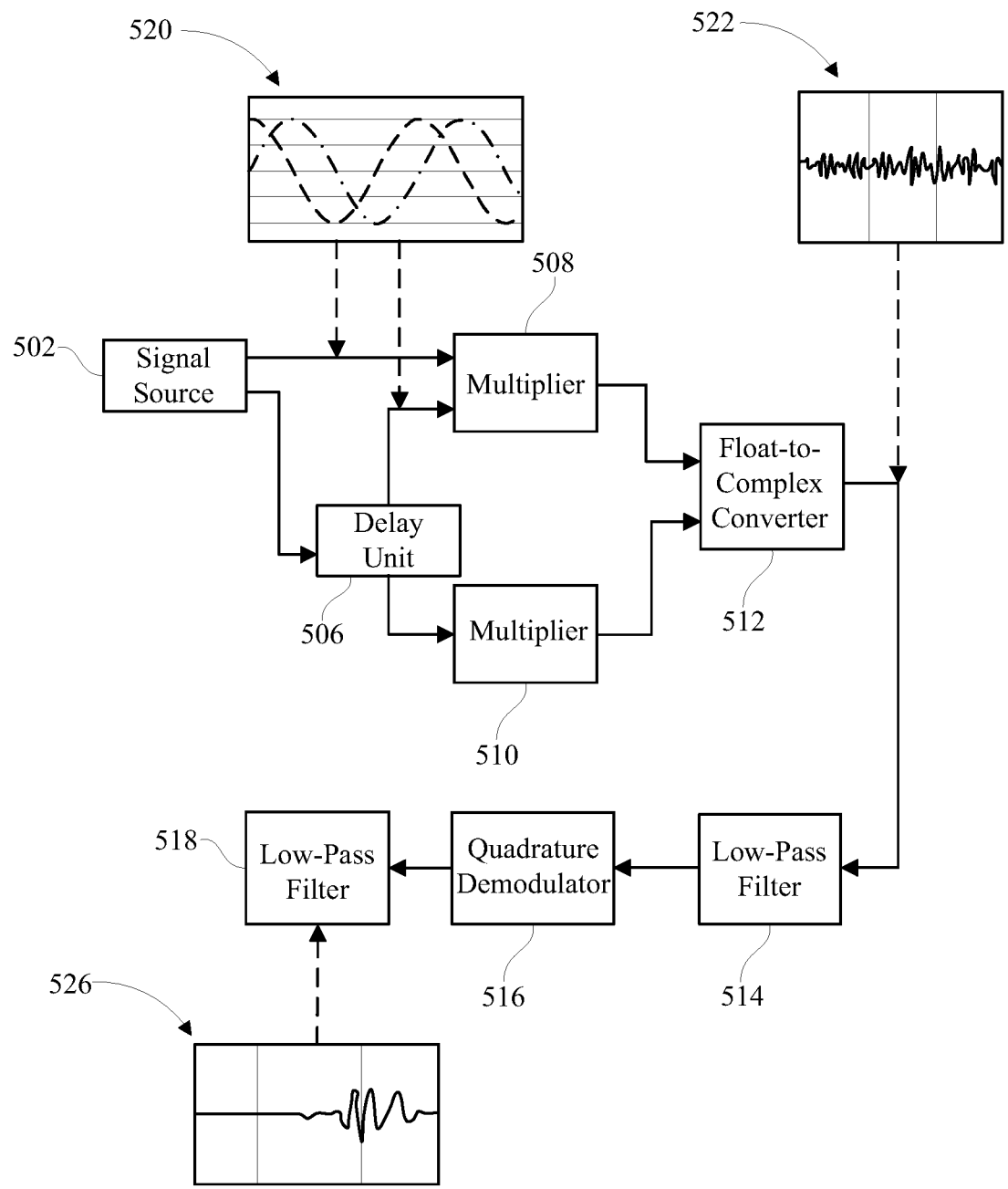
FIG. 5 depicts a conjugate multiplication arrangement for extracting frequency components according to one embodiment.

FIG. 5 depicts an example arrangement (processor-executable code, hardwired circuitry, or a combination thereof) that in some embodiments can be used for extracting a signal frequency at block 106 and/or block 114 using conjugate multiplication. The example arrangement operates by generating an I/Q digital stream from an incoming signal (illustratively, an analog signal) and extracting the signal frequency by conjugate multiplication. Signal source 502 is illustratively input into delay unit 506. Delay unit 506 creates a sine and a cosine signal. The cosine signal is generated by delaying the sine signal by 90°. The output of delay unit 506 refers to the signal diagram 520. Multiplier 508 receives the output signals of the signal source 502 and the delay unit 506 for the Q stream; and multiplier 510 receives an output of the delay unit 506 for the I stream. A float-to-complex converter 512 uses the Q data stream and the I data stream as input. An output signal of the float-to-complex converter 512 is shown in the diagram 522, in particular, the I/Q data stream overlaid on the source signal.

Low pass filter 514 follows in the signal stream with, for example, the following characteristics: decimation: 1 [1/sec]; sample rate 44.1 [kHz]; cut-off frequency: 1.5 [kHz]; transition width: 200; window: Hamming beta: 6.76. The output of low pass filter 514 is fed to quadrature demodulator 516, which illustratively has a gate of 7.01874 k. Quadrature demodulator 516 is a conjugate multiplication block and thus in complex number theory provides an output with a linear relationship to the frequency contained within the I/Q stream. Low pass filter 518 illustratively has the following characteristics: decimation: 1 [1/sec]; gate 1; sample rate 44.1 [kHz]; cut-off frequency: 400 [Hz]; transitions width 10; window: Hamming beta 6.76. It is noted that, here, the term 'decimation' specifically relates to a decimation of signal samples per second. So, if one has 1000 samples per second and one decimates by 10 then there are only 100 samples as output. (This also can relieve the processor and other circuits from an overload, as well as mitigate power consumption.) The transition width makes the −3 dB frequency window. An extracted frequency pattern is shown in diagram 526.

Figure 6:
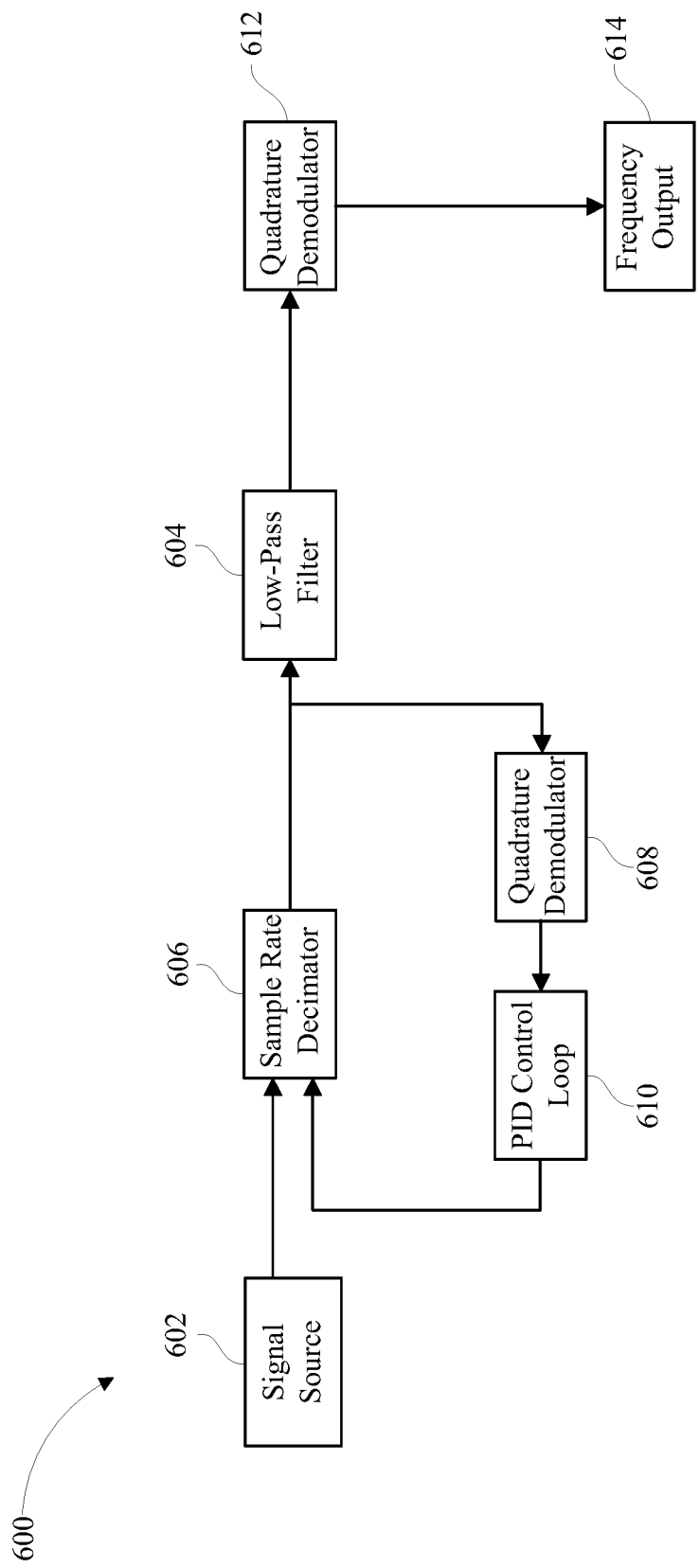
FIG. 6 depicts a system for dynamically setting digital signal processor sampling rates according to one embodiment.

FIG. 6 depicts an example system for dynamically setting rates for sampling a signal input, according to one embodiment, in which the input is digitized and enters the system at a fixed number of samples per second. Signal source 602 provides a digital signal having the following characteristics: sample rate: 10 [kHz]; waveform: cosine; frequency: 10 [kHz]; amplitude: 1; offset: 0. Low pass filter 604 has the following characteristics: decimation 1 [1/sec]; gain: 1; sample rate 80 [kHz]; cutoff frequency 20 [kHz]; transition width 800; beta 6.76. Interposed between signal source 602 and low pass filter 604 is sample rate decimator 606 (decimation initially 1, as above in FIG. 5) and quadrature demodulator 608 (gain: 25.4648). Quadrature demodulator 608 performs conjugate multiplication to extract a value representing frequency, which is provided to PID control loop 610. PID control loop 610 controls sample rate decimator 606, changing the sampling rate by decimating or increasing the current rate as necessary such that the sampling rate is just enough greater than twice the signal's highest frequency component to accurately process the signal. The filtered signal output from low pass filter is fed to quadrature modulator 612 (gain: 25.4648·decimation as set by sample rate decimator 606). Quadrature modulator 612 extracts frequency (conjugate multiplication) output 614. The frequency output 614 can be input into a control loop that controls a decimator/interpolator for dynamically setting a sampling rate as the frequency of the input signal varies.

Figure 7:
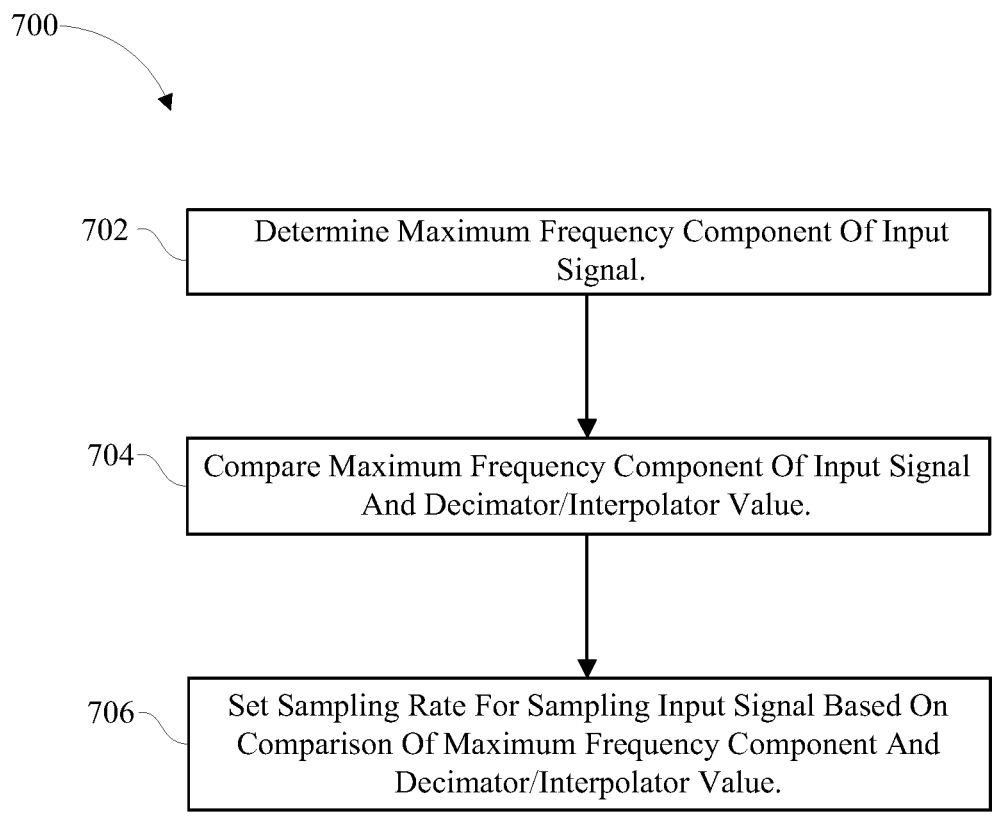
FIG. 7 depicts a method of dynamically setting signal processor sampling rates according to one embodiment.

FIG. 7 depicts one embodiment of a method 700 of dynamically setting sampling rates during a data processing event. The method can be performed by a system having the operative features and capabilities described in FIGS. 1-6. The system illustratively determines the maximum frequency component of an input signal at 702. At 704, the system compares the maximum frequency component to a current value of a decimator/interpolator, the current value being the amount by which the sampling rate is decimated or interpolated. The system sets the sampling rate for sampling the input signal at 706. The system sets the sampling rate based on the comparison of the maximum frequency component and decimator/interpolator value made at 704.

Figure 8:
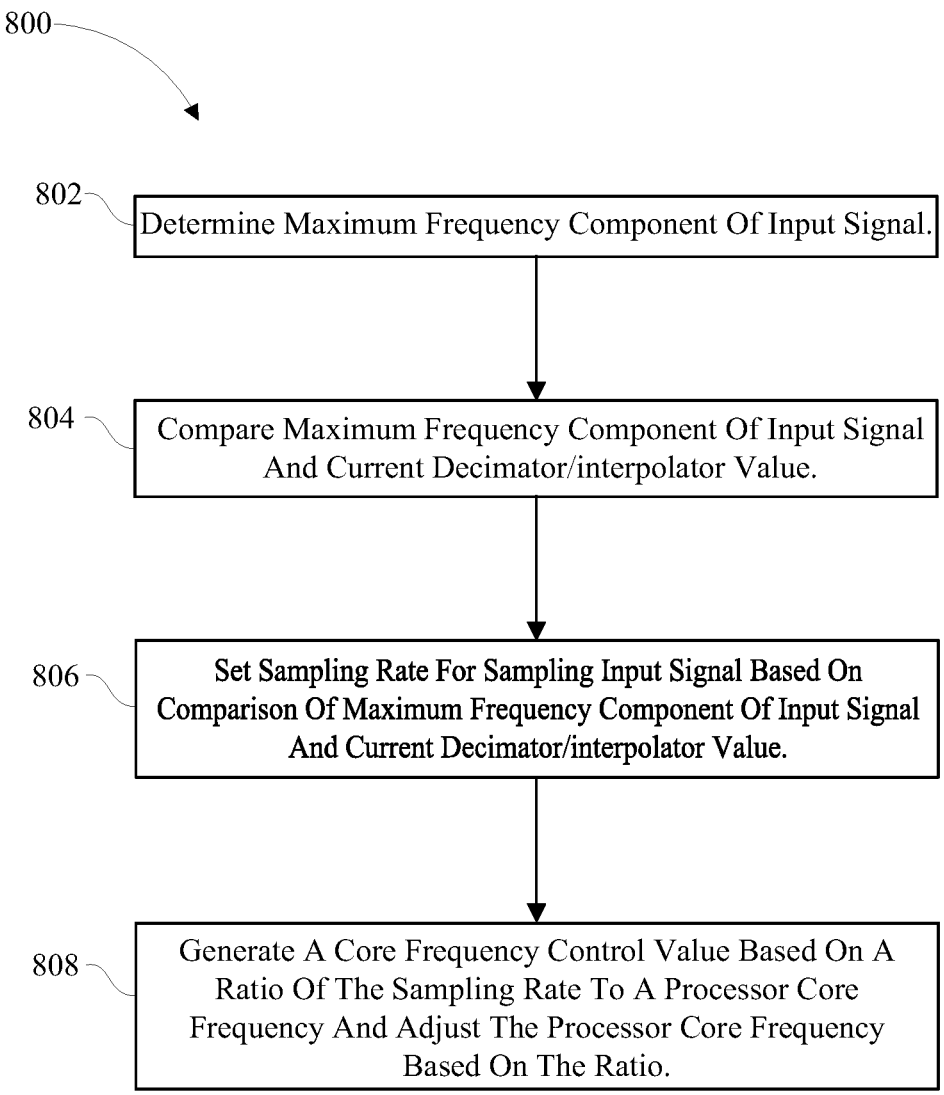
FIG. 8 depicts a method of dynamically setting signal processor sampling rates according to one embodiment.

Method 700 provides a mechanism for dynamically adjusting sampling rates, which in turn can mitigate power consumption of a system during a data processing event. FIG. 8 illustrates a method, according to another embodiment, of influencing a system's power consumption by setting a core processing rate in conjunction with and based on a dynamically set sampling rate. The method can be performed by a system having the operative features and capabilities described in FIGS. 1-6.

As illustrated in FIG. 8, method 800 can begin with the system determining a maximum frequency component of an input signal at 802. At 804, the system compares the maximum frequency component with a current decimator/interpolator value. The system adjusts the sampling rate at 806. The sampling rate can be thus be set to ensure the system can accurately process the system by sampling at a rate just greater than twice the frequency of the highest component present in the signal (based on the Nyquist theorem). The sampling rate need only be slightly greater than twice the maximum frequency component. If the sampling rate is much higher, the system can decimate the sampling rate until the rate is just high enough to capture the highest frequency component, but no higher. The system at 808 generates a core frequency control value and adjusts the processor core frequency of a signal processor based on the generated core frequency control value. Specifically, in one embodiment, the core frequency control value, CPUf, is pre-calculated as a ratio between samples per second through the signal processing system and a CPU core frequency. The CPU core frequency is set as follows: CPU core frequency=F*CPUf, where F is the highest frequency component.

Figure 9:
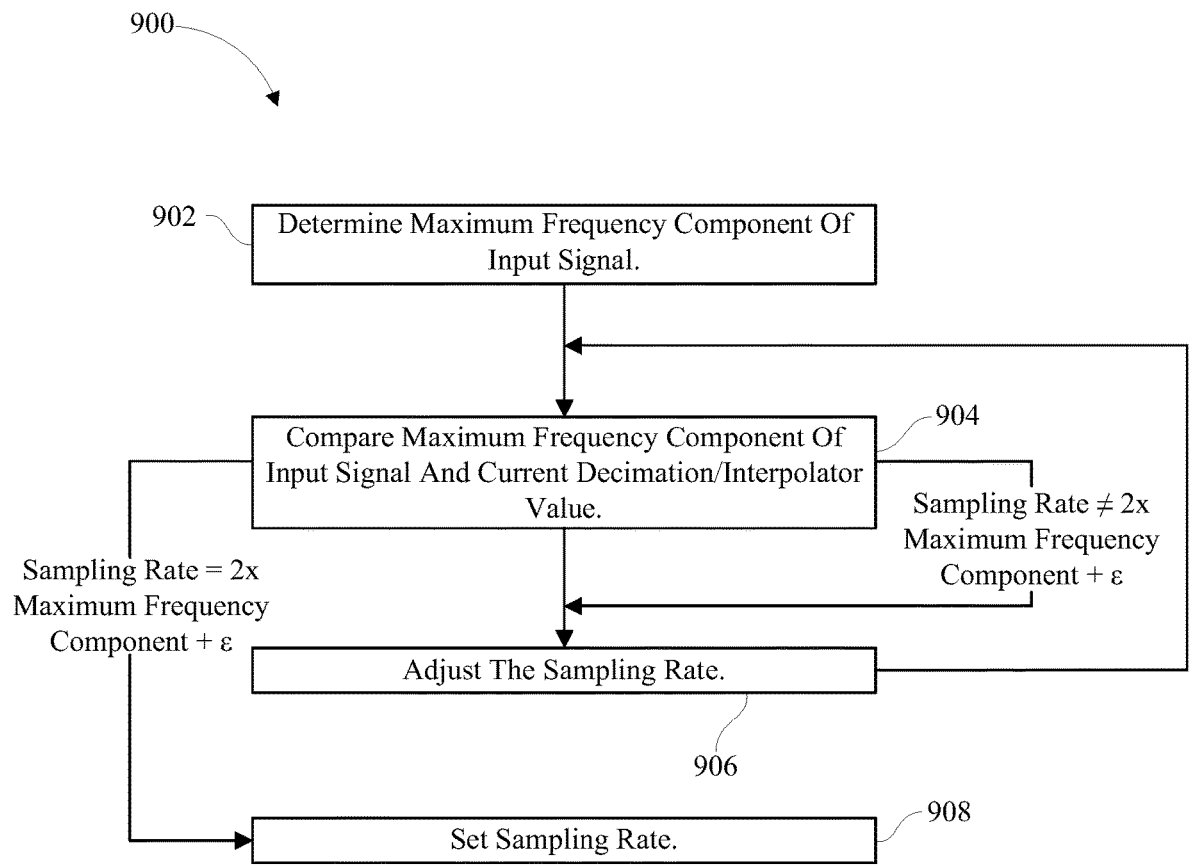
FIG. 9 depicts a frequency demodulator according to one embodiment.

FIG. 9 depicts another embodiment a method 900 for dynamically setting sampling rates during a data processing event. The method also can be performed by a system having the operative features and capabilities described in FIGS. 1-6. The system determines a maximum frequency component of an input signal at 902. At 904, the system compares the maximum frequency and a current value of a decimation/interpolator. If the current sampling rate is just slightly more than twice the maximum frequency component (e.g., sampling rate=[2×(maximum frequency component)]+ε; 0<ε<<1), the sampling rate is set at that rate at 908. Otherwise, at 906 the sampling rate is adjusted up (e.g., interpolation) or down (e.g., decimation or downsampling). The adjustment of the sample rate is repeated as necessary until the current sampling rate is just slightly more twice the maximum frequency component and set at that rate at 908.

The methods described in FIGS. 7-9 for dynamically setting a rate for sampling a signal can be implemented in processor-executable code, in hardwired circuitry, or a combination code and circuitry. Dynamically setting the rate for sampling a signal can be performed (e.g., in real time) during a signal processing event. Dynamic rate setting as disclosed herein can be performed as part of a signal processing procedure (e.g., digital signal processing) executed on a computer or by another system or device for performing signal processing.

Figure 10:
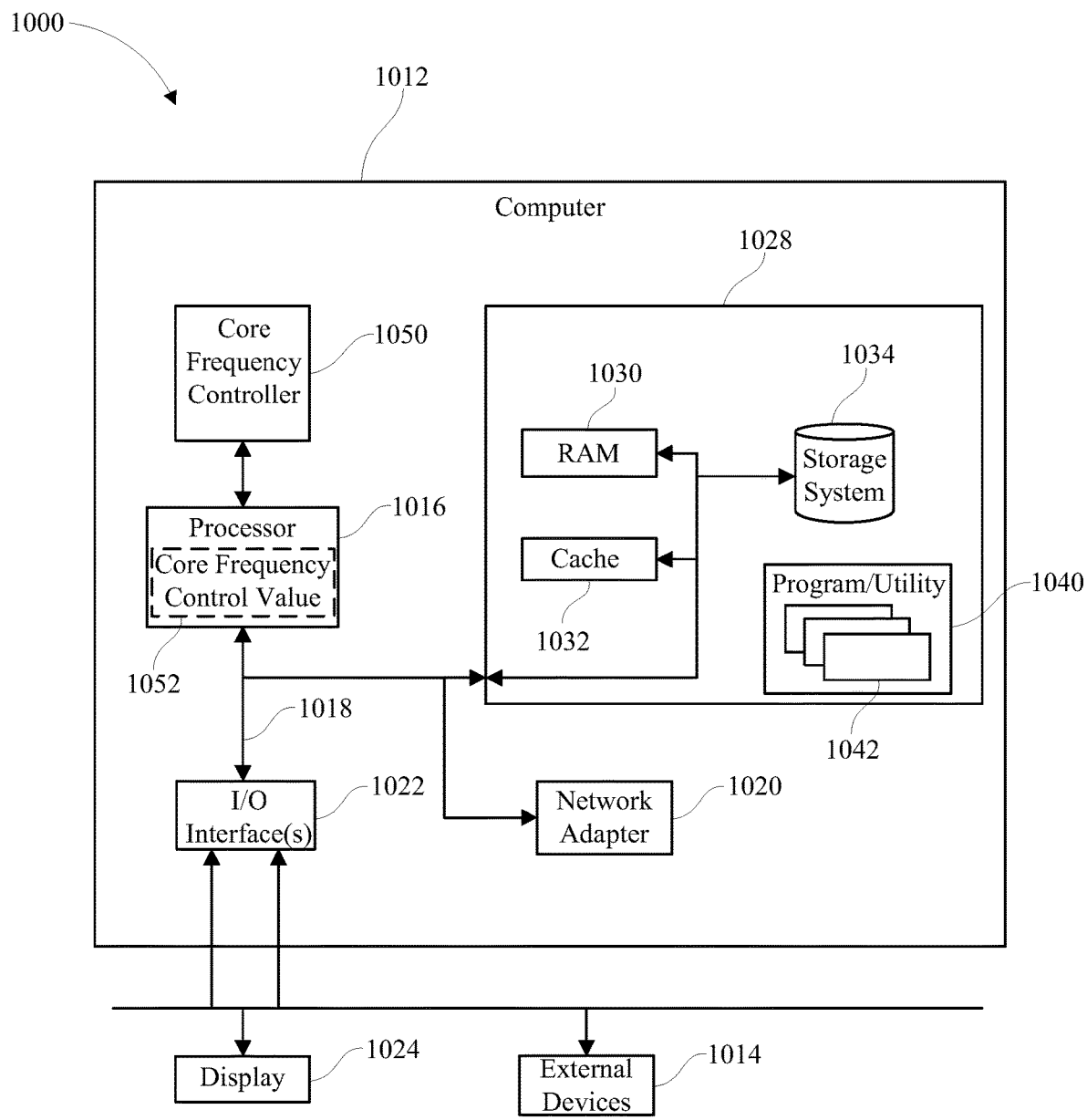
FIG. 10 depicts an example computer structure for implementing a system for dynamically setting signal processor sampling rates according to one embodiment.

FIG. 10 depicts a signal processing environment 1000 in which a rate for sampling a signal can be dynamically set. Signal processing environment 1000 illustratively includes an example computer 1012 with which sampling rates can be dynamically set in conjunction with the processing of a signal as the signal frequency varies. The sampling rate can be adjusted as the frequency varies to thereby set a rate that mitigates power consumption by the computer. Computer 1012 is only one example of a suitable system for implementing the various signal processing operations and procedures disclosed herein. Accordingly, computer 1012 is not intended to suggest any limitation as to the scope of use or functionality of embodiments described herein. Regardless, computer 1012 is capable of implementing and/or performing any of the functionality set forth hereinabove.

Computer 1012 is operational with numerous other general- or special-purpose computing system environments or configurations. Examples of well-known computing systems, environments, and/or configurations that are suitable for use with computer 1012 include, but are not limited to, personal computers, servers, thin clients, thick clients, handheld or laptop devices, multiprocessor systems, microprocessor-based systems, set top boxes, programmable consumer electronics, network PCs, minicomputers, mainframe computers, and distributed cloud computing environments that include any of the above systems or devices, and the like.

Computer 1012 can be described in the general context of computer system-executable instructions, such as program modules, executed by a computer or computing system. Generally, program modules can include routines, programs, objects, components, logic, data structures, and so on that perform particular tasks or implement particular abstract data types. Computer 1012 can be practiced in distributed cloud computing environments where tasks are performed by remote processing devices that are linked through a communications network. In a distributed cloud computing environment, program modules can be located in both local and remote computer system storage media including memory storage devices.

Illustratively, computer 1012 is a general-purpose computing device. The components of computer 1012 can include, but are not limited to, one or more processors 1016, a memory 1028, and a bus 1018 that couples various system components including memory 1028 to processor 1016.

Bus 1018 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer 1012 typically includes a variety of computer-readable media. Such media can be any available media that is accessible by computer 1012, and includes both volatile and non-volatile media, removable and non-removable media.

Memory 1028 can include computer-readable media in the form of volatile memory, such as random-access memory (RAM) 1030 and/or cache memory 1032. Computer 1012 can further include other removable/non-removable, volatile/non-volatile computer storage media. By way of example, storage system 1034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1018 by one or more data media interfaces. As further depicted and described below, memory 1028 can include at least one program product having a set (e.g., at least one) of program modules that are configured to carry out the functions of embodiments of the invention.

Program/utility 1040, having a set (at least one) of program modules 1042, can be stored in memory 1028 by way of example, and not limitation, as well as an operating system, one or more application programs, other program modules, and program data. Each of the operating system, one or more application programs, other program modules, and program data or some combination thereof, can include an implementation of a networking environment. Program modules 1042 generally carry out the functions and/or methodologies of embodiments of the invention as described herein.

Program/utility 1040 is executable by processor 1016. Program/utility 1040 and any data items used, generated, and/or operated upon are functional data structures that impart functionality. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Computer 1012 can also communicate with one or more external devices 1014 such as a keyboard, a pointing device, a display 1024, etc.; one or more devices that enable a user to interact with computer 1012; and/or any devices (e.g., network card, modem, etc.) that enable computer 1012 to communicate with one or more other computing devices. Such communication can occur via input/output (I/O) interfaces 1022. Computer 1012 can communicate with one or more networks such as a local area network (LAN), a general wide area network (WAN), and/or a public network (e.g., the Internet) via network adapter 1020. As depicted, network adapter 1020 communicates with the other components of computer 1012 via bus 1018. It is understood that, although not shown, other hardware and/or software components could be used in conjunction with computer 1012. Examples include, but are not limited to, the following: microcode, device drivers, redundant processing units, external disk drive arrays, RAID systems, tape drives, and data archival storage systems.

The processing speed of computer 1012 is determined by the core frequency of processor 1016. The processor core frequency can be controlled by core frequency controller 1050.

Computer 1012 can digitally process an input signal, or data stream, received from one of external devices 1014 via I/O interface 1022. The input signal can be, for example, the output of an ADC that converts an analogue signal into a digital stream or a digital stream such as a voice or video recording. The input signal can thus be received at fixed number of samples per second. The computer 1012 performs digital signal processing on the input signal by executing with processor 1016 processor-executable code stored in memory 1028 and conveyed to the processor from the memory via bus 1018.

A system for dynamically setting the sampling rate of the input signal and setting a core frequency control value, as described above, can be implemented as processor-executable code, which also can be stored in memory 1028 and executed by processor 1016 when conveyed to the processor from the memory via bus 1018. The system dynamically sets the sampling rate and based on the sampling rate determines core frequency control value 1052. Core frequency control value 1052 is fed to core frequency controller 1050. Operatively, as the frequency of the input signal varies, the sampling rate is adjusted accordingly and a new core frequency control value determined, which is then conveyed to the core frequency controller 1050 to adjust the processor core frequency.

Figure 11:
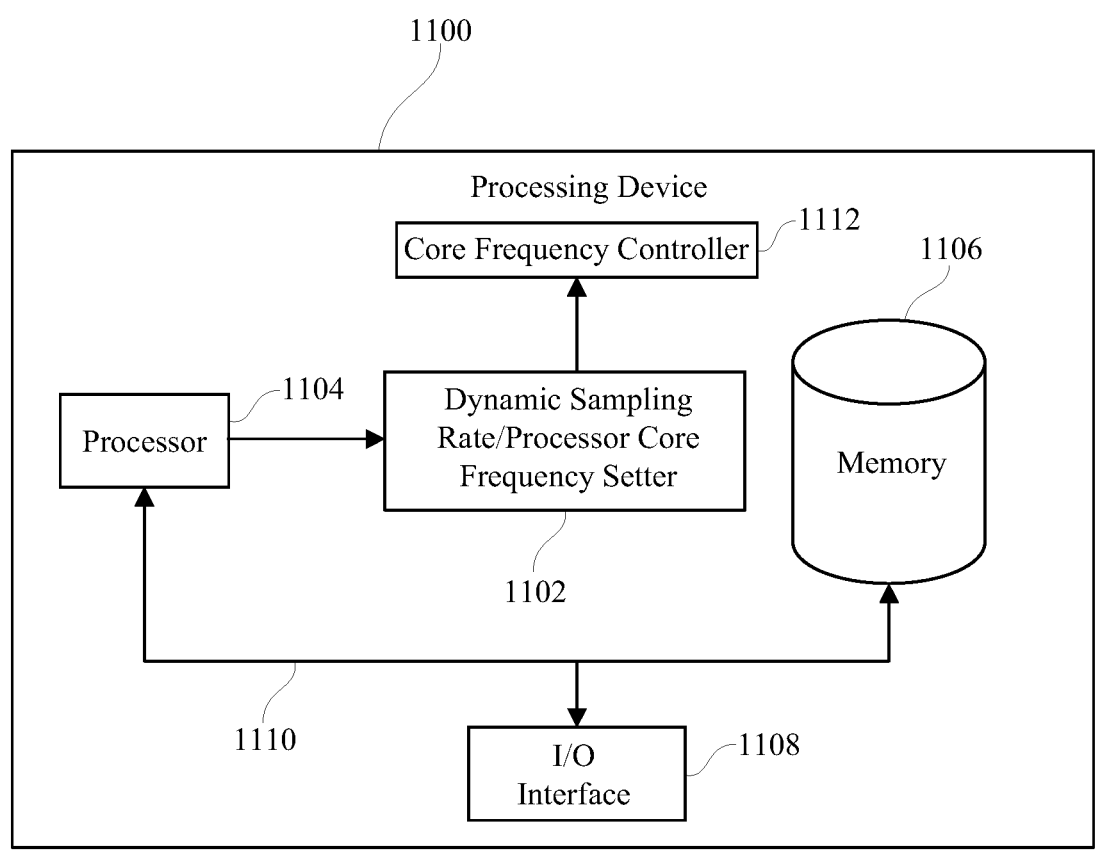
FIG. 11 depicts a processing device operating in conjunction with a system for dynamically setting signal processor sampling rates and determining a core frequency control value for controlling the processing speed of the processing device according to one embodiment.

FIG. 11 depicts a processing device 1100 that operates in conjunction with a system 1102 for dynamically adjusting the rate for sampling an input signal, or data stream, and setting a core frequency control value based on adjusted sampling rates, according to another embodiment. Processing device 1100 can comprise a general-purpose or application-specific computer or other device having signal processing capabilities (e.g., digital signal processor). Processing device 1100 illustratively includes processor 1104, memory 1106, and I/O interface 1108, each communicatively coupled via bus 1110. The processing speed of processing device 1100 is controlled by core frequency controller 1112.

Processing device 1100 processes an input signal, or data stream, received from an external source (not shown) via I/O device 1108. As the input signal frequency varies, system 1102 dynamically adjusts the sampling rate as described above. As also described above, system 1102 determines a core frequency control value based on each sampling rate. The core frequency control value is conveyed to core frequency controller 1112, which determines based on the core frequency control value the processor core frequency of processor 1104. As the frequency of the input signal varies, the sampling rate is adjusted accordingly and a new core frequency control value is determined, which is conveyed to the core frequency controller 1112. Thus, the processor core frequency varies as the input signal frequency varies in a manner that mitigates power consumption by the processing device 1100.

Core frequency controller 1112 is illustratively a separate component of processing device 1100. In other embodiments, however, core frequency controller can be implemented in processor 1104 (e.g., as processor-executable code). System 1102 also can be implemented in hardwired circuitry within processing device 1100 or as a separate device, external to and detachably connectable with (e.g., adapter or plug-in), the circuitry of processing device 1100. In other embodiments, system 1102 like core frequency controller 1112 also can be implemented in processor 1104 (e.g., as processor-executable code as described in reference to FIG. 10). Accordingly, the energy-saving benefits of setting a core frequency based on a dynamically adjusted sampling rate can be achieved without specialized circuitry.

The methods disclosed herein also can be implemented in a computer program. The computer program can be stored and implemented in a computer program product. A computer program product includes a computer readable storage medium (or media) having computer readable program instructions thereon for causing a processor to carry out the various operations disclosed herein.

The computer readable storage medium can be a tangible device that can retain and store instructions for use by any instruction execution device. The computer readable storage medium can be, for example, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions, as described herein, can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages.

The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

With respect to any aspects of the embodiments described herein with reference to flowchart illustrations and/or block diagrams of methods, apparatus (systems), and computer program products, it is to be understood that each such flowchart illustration, block diagram, and combination of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIGS. 1-11 are conceptual illustrations allowing for full explanation of the embodiments disclosed herein. The figures and examples disclosed are not meant to limit the scope of the disclosure to a single embodiment, as other embodiments are possible by way of interchange of some or all of the described or illustrated elements. Moreover, where certain elements can be partially or fully implemented using known components, only those portions of such known components that are necessary for an understanding of the disclosure are described; detailed descriptions of other portions of such known components are omitted so as not to obscure any aspects of the embodiments disclosed. In the present specification, an embodiment showing a singular component should not necessarily be limited to other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the disclosure encompasses present and future known equivalents to the known components referred to herein by way of illustration.

The descriptions of the various embodiments have been presented only for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

That which is claimed is:

1. A computer-implemented method within a computer hardware system including an I/O device, a processor, and a core frequency controller, comprising:
   receiving, by the I/O device, an input signal from an external device;
   determining, with the processor, a maximum frequency of the input signal;
   comparing the maximum frequency to a current decimator/interpolator value that is an amount by which a sampling rate is decimated or interpolated;
   setting, within the core frequency controller and based on the comparison, the sampling rate for sampling the input signal with the processor as part of a digital signal processing event;
   controlling, by the core frequency controller, a processor core frequency of the processor based upon the sampling rate; and
   sampling, by the processor using the processor core frequency, the input signal.

2. The method of claim 1, further comprising
   generating a core frequency control value based on a ratio of the sampling rate to the processor core frequency and adjusting the processor core frequency based on the ratio, wherein
   the core frequency control value is conveyed to the core frequency controller.

3. The method of claim 1, wherein
   the setting comprises setting the sampling rate equal to twice a product of one plus a predetermined percentage and the maximum frequency.

4. The method of claim 1, wherein
   the determining comprises extracting the maximum frequency based on conjugate multiplication.

5. The method of claim 4, wherein
   the conjugate multiplication is performed using a quadrature demodulator.

6. The method of claim 1, further comprising
   generating a new decimator/interpolator value using a proportional-integral-derivative (PID) control loop.

7. A computer hardware system, comprising:
   an I/O device;
   a core frequency controller; and
   at least one processor programmed to initiate the following executable operations:

receiving, by the I/O device, an input signal from an external device
determining a maximum frequency of the input signal;
comparing the maximum frequency to a current decimator/interpolator value that is an amount by which a sampling rate is decimated or interpolated;
setting, within the core frequency controller and based on the comparison, the sampling rate for sampling the input signal with the processor as part of a digital signal processing event;
controlling, by the core frequency controller, a processor core frequency of the processor based upon the sampling rate; and
sampling, by the processor using the processor core frequency, the input signal.

8. The system of claim 7, wherein the processor is further programmed to initiate the following executable operation
generating a core frequency control value based on a ratio of the sampling rate to the processor core frequency and adjusting the processor core frequency based on the ratio, wherein
the core frequency control value is conveyed to the core frequency controller.

9. The system of claim 7, wherein
the setting comprises setting the sampling rate equal to twice a product of one plus a predetermined percentage and the maximum frequency.

10. The system of claim 9, wherein
the determining comprises extracting the maximum frequency based on conjugate multiplication.

11. The system of claim 10, wherein
the conjugate multiplication is performed using a quadrature demodulator.

12. A computer program product, comprising:
a computer-readable storage medium having program code stored thereon, the program code, which when executed by a computer hardware system including an I/O device, a processor, and a core frequency controller, causes the computer hardware system to perform:
receiving, by the I/O device, an input signal from an external device;
determining, with the processor, a maximum frequency of the input signal;
comparing the maximum frequency to a current decimator/interpolator value that is an amount by which a sampling rate is decimated or interpolated;
setting, within the core frequency controller and based on the comparison, the sampling rate for sampling the input signal with the processor as part of a digital signal processing event;
controlling, by the core frequency controller, a processor core frequency of the processor based upon the sampling rate; and
sampling, by the processor using the processor core frequency, the input signal.

13. The computer program product of claim 12, wherein the program code further causes the computer hardware system to perform
generating a core frequency control value based on a ratio of the sampling rate to the processor core frequency and adjusting the processor core frequency based on the ratio, wherein
the core frequency control value is conveyed to the core frequency controller.

14. The computer program product of claim 12, wherein
the setting comprises setting the sampling rate equal to twice a product of one plus a predetermined percentage and the maximum frequency.

15. The computer program product of claim 12, wherein
the determining comprises extracting the maximum frequency based on conjugate multiplication.

16. The computer program product of claim 15, wherein
the conjugate multiplication is performed using a quadrature demodulator.

17. The computer program product of claim 12, wherein the program code further causes the computer hardware system to perform
generating a new decimator/interpolator value using a proportional-integral-derivative (PID) control loop.

* * * * *